United States Patent
Mokhtarzad (10) Patent No.: US 9,480,149 B2
(45) Date of Patent: Oct. 25, 2016

(54) PRINTED CIRCUIT BOARD WITH FLUID FLOW CHANNELS

(71) Applicant: Brocade Communications Systems, Inc., San Jose, CA (US)

(72) Inventor: Shahriar Mokhtarzad, Milpitas, CA (US)

(73) Assignee: BROCADE COMMUNICATIONS SYSTEMS, INC., San Jose, CA (US)

( * ) Notice: Subject to any disclaimer, the term of this patent is extended or adjusted under 35 U.S.C. 154(b) by 138 days.

(21) Appl. No.: 14/230,843

(22) Filed: Mar. 31, 2014

(65) Prior Publication Data

US 2015/0163898 A1  Jun. 11, 2015

Related U.S. Application Data (60) Provisional application No. 61/914,243, filed on Dec. 10, 2013.

(51) Int. Cl.
*H05K 1/02* (2006.01)
*H05K 9/00* (2006.01)
*H05K 1/18* (2006.01)

(52) U.S. Cl.
CPC .......... *H05K 1/0272* (2013.01); *H05K 9/0024* (2013.01); *H05K 1/0203* (2013.01); *H05K 1/181* (2013.01); *H05K 2201/064* (2013.01);
(Continued)

(58) Field of Classification Search
CPC ...... H05K 7/20; H05K 7/209; H05K 1/0272; H05K 1/201; H05K 9/0024; H05K 1/02; H05K 9/00; H01L 23/467; H01L 23/473; H01L 23/552; F28F 3/12

USPC ............. 361/679.46–679.54, 688, 689, 698, 361/699, 702–712, 715–722; 165/80.2, 165/80.4, 80.5, 104.33, 104.34, 185; 174/15.1, 15.3, 16.3, 252; 257/706–727; 62/259.2

See application file for complete search history.

(56) References Cited

U.S. PATENT DOCUMENTS

| | | |
|---|---|---|
| 4,536,824 A | 8/1985 | Barrett et al. |
| 4,674,004 A | 6/1987 | Smith et al. |
| 4,718,163 A | 1/1988 | Berland et al. |

(Continued)

FOREIGN PATENT DOCUMENTS

| | | |
|---|---|---|
| DE | 4012100 A1 | 10/1991 |
| EP | 0844808 | 5/1998 |

(Continued)

OTHER PUBLICATIONS http://link.springer.com/article/10.1007/BF02946541 (accessed Dec. 12, 2013), Kim, Kwang Soo et al., "Cooling characteristics on the forced convection of an array of flat-form electronic components in channel flow," KSME International Journal, Jan. 1998, vol. 12, Issue 1, pp. 132-142, (Abstract Only) (2 pages).

(Continued)

*Primary Examiner* — Michail V Datskovskiy
(74) *Attorney, Agent, or Firm* — Conley Rose, P.C.

(57) ABSTRACT

An embodiment of an electronic system includes a printed circuit board (PCB) including fluid flow channel extending through the PCB. In addition, the electronic system includes an electronic component including a bottom surface and positioned on the PCB over the fluid flow channel to thereby expose the bottom surface of the electronic component to fluid flow through the fluid flow channel.

17 Claims, 8 Drawing Sheets

(52) U.S. Cl.
CPC .............. *H05K2201/09072* (2013.01); *H05K 2201/10515* (2013.01); *H05K 2201/10522* (2013.01)

(56) References Cited

U.S. PATENT DOCUMENTS

| | | | | |
|---|---|---|---|---|
| 5,067,047 | A * | 11/1991 | Azar | H05K 1/0272 |
| | | | | 165/908 |
| 5,453,911 | A * | 9/1995 | Wolgemuth | H05K 7/20927 |
| | | | | 165/80.4 |
| 5,544,012 | A | 8/1996 | Koike | |
| 5,801,442 | A | 9/1998 | Hamilton | |
| 5,818,692 | A * | 10/1998 | Denney, Jr. | H01L 23/473 |
| | | | | 165/80.3 |
| 5,901,037 | A * | 5/1999 | Hamilton | F28F 3/12 |
| | | | | 165/80.4 |
| 5,910,884 | A | 6/1999 | Garza et al. | |
| 6,129,145 | A | 10/2000 | Yamamoto et al. | |
| 6,388,317 | B1 * | 5/2002 | Reese | H01L 23/473 |
| | | | | 257/713 |
| 6,506,624 | B2 | 1/2003 | Tatoh et al. | |
| 6,538,881 | B1 | 3/2003 | Jeakins et al. | |
| 6,738,253 | B2 * | 5/2004 | Beuille | H01L 23/367 |
| | | | | 257/678 |
| 6,771,500 | B1 * | 8/2004 | Siegel | H01L 23/3675 |
| | | | | 165/80.4 |
| 7,214,889 | B2 * | 5/2007 | Mazurkiewicz | H01L 23/552 |
| | | | | 174/377 |
| 7,215,547 | B2 * | 5/2007 | Chang | H05K 1/0272 |
| | | | | 165/104.33 |
| 7,345,876 | B2 | 3/2008 | Hong et al. | |
| 7,397,665 | B2 | 7/2008 | Yuval | |
| 7,476,038 | B2 | 1/2009 | Oikawa et al. | |
| 7,502,229 | B2 | 3/2009 | Bordiga | |
| 7,738,249 | B2 | 6/2010 | Chan et al. | |
| 8,004,860 | B2 * | 8/2011 | Salzman | H05K 3/284 |
| | | | | 174/350 |
| 8,018,723 | B1 | 9/2011 | Yu et al. | |
| 8,064,200 | B1 | 11/2011 | West et al. | |
| 8,179,676 | B2 | 5/2012 | Julien et al. | |
| 8,279,601 | B2 | 10/2012 | Lima et al. | |
| 8,297,805 | B2 | 10/2012 | Roucoules et al. | |
| 8,416,570 | B2 | 4/2013 | Zeng et al. | |
| 8,438,583 | B2 | 5/2013 | Li et al. | |
| 8,482,919 | B2 * | 7/2013 | Dede | H01L 23/473 |
| | | | | 165/80.4 |
| 2002/0196610 | A1 * | 12/2002 | Beuille | H01L 23/367 |
| | | | | 361/746 |
| 2004/0013545 | A1 * | 1/2004 | Brown | F04B 43/043 |
| | | | | 417/413.3 |
| 2006/0034052 | A1 * | 2/2006 | Chang | H05K 1/0272 |
| | | | | 361/697 |
| 2009/0128935 | A1 * | 5/2009 | Nishino | G02B 26/0841 |
| | | | | 359/845 |
| 2011/0002102 | A1 * | 1/2011 | Brok | H01L 23/467 |
| | | | | 361/701 |
| 2012/0300402 | A1 | 11/2012 | Vos | |
| 2013/0064512 | A1 | 3/2013 | Ghantiwala | |
| 2013/0319547 | A1 * | 12/2013 | Pagel | A61M 13/003 |
| | | | | 137/505 |

FOREIGN PATENT DOCUMENTS

| | | | | |
|---|---|---|---|---|
| JP | 59143388 | A * | 8/1984 | .............. H05K 7/20 |
| TW | 415307 | U * | 11/2011 | .............. G02B 1/00 |

OTHER PUBLICATIONS http://ieeexplore.ieee.org/xpl/login.jsp?tp=&arnumber=1134734&url=http%3A%2F%2Fieeexplore.ieee.org%2Fxpls%2Fabs_all.jsp%3Farnumber%3D1134734 (accessed Dec. 12, 2013), Bar-Cohen, A., "Thermal Management of Air-and Liquid-Cooled Multichip Modules," IEEE Xplore, Jun. 1987, pp. 159-175 (Abstract Only) (2 pages).

\* cited by examiner

PRINTED CIRCUIT BOARD WITH FLUID FLOW CHANNELS

CROSS-REFERENCE TO RELATED APPLICATIONS

This application claims the benefit of U.S. provisional patent application Ser. No. 61/914,243 filed Dec. 10, 2013, and entitled "Printed Circuit Board with Air Flow Channels," which is hereby incorporated herein by reference in its entirety.

STATEMENT REGARDING FEDERALLY SPONSORED RESEARCH OR DEVELOPMENT

Not applicable.

BACKGROUND

The disclosure relates generally to electronic circuit boards and more particularly to the regulation of temperature of electronic components that are positioned on such electronic circuit boards.

Cooling large numbers of electrical modules on a printed circuit board (PCB) is usually achieved by arranging one or more active components (e.g., electronic components) in close proximity to each other on a surface of the PCB in some fashion (e.g., a single or double stacked connector arrangement). Air then flows over the components from side to side and/or from front to back in an attempt to maintain a proper operating temperature. Components that are positioned at the outer edges of the arrangement tend to have more surface area exposed to the flow of air such that their temperature is more efficiently regulated than the components positioned near the middle of the arrangement. As a result, there is typically a high level of variability in the temperature of components disposed in such arrangements on a PCB.

BRIEF DESCRIPTION OF THE DRAWINGS

For a detailed description of the preferred embodiments of the invention, reference will now be made to the accompanying drawings in which.

DETAILED DESCRIPTION

The following discussion is directed to various exemplary embodiments. However, one skilled in the art will understand that the examples disclosed herein have broad application, and that the discussion of any embodiment is meant only to be exemplary of that embodiment, and not intended to suggest that the scope of the disclosure, including the claims, is limited to that embodiment. Certain terms are used throughout the following description and claims to refer to particular features or components. As one skilled in the art will appreciate, different persons may refer to the same feature or component by different names. This document does not intend to distinguish between components or features that differ in name but not function. The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices, components, and connections. In addition, as used herein, the terms "axial" and "axially" generally mean along or parallel to a central axis (e.g., central axis of a body or a port), while the terms "radial" and "radially" generally mean perpendicular to the central axis. For instance, an axial distance refers to a distance measured along or parallel to the central axis, and a radial distance means a distance measured perpendicular to the central axis.

As previously described, electronic components are typically arranged on a surface of a PCB in close proximity to one another such that components disposed at the outer edges of the arrangement have a larger amount of surface area that is exposed to air flowing across the PCB than the components disposed within the interior of the arrangement. As a result, the operating temperatures for these more interior components tend to be relatively high during operations. For example, referring now to FIG. 1, wherein a conventional electronic system 10 is shown. Electronic system 10 includes a substrate 20 and a plurality of electronic modules or components 50 disposed on substrate 20. In this embodiment, substrate 20 comprises a PCB and includes a first or upper surface 20a, and a second or lower surface 20b that is opposite the upper surface 20a.

Figure 1:
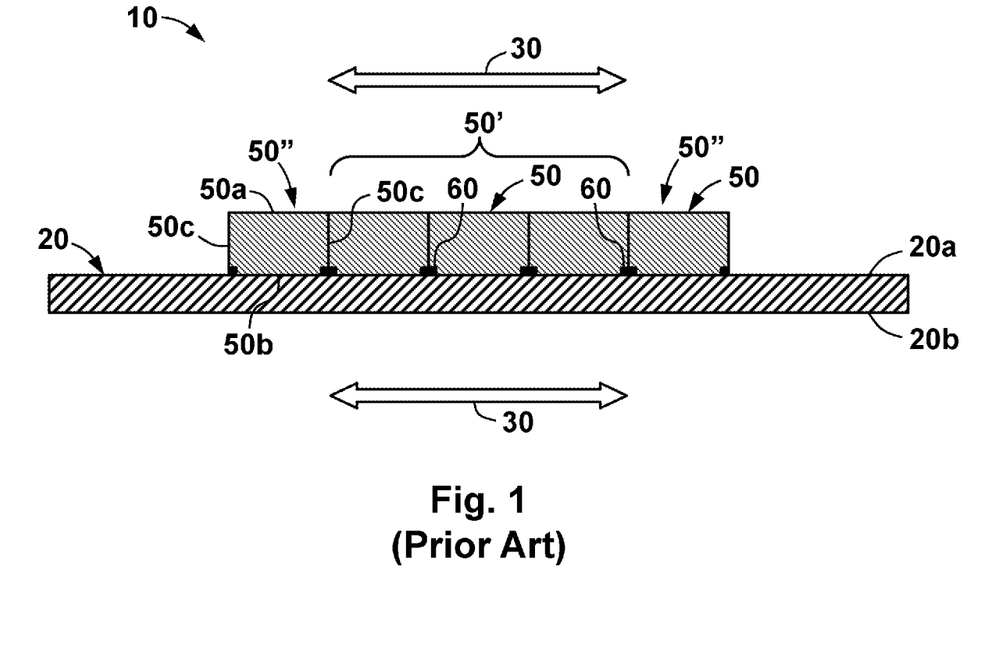
FIG. 1 shows a schematic side cross-sectional view of a conventional electronic system.

Each of the electronic components 50 includes a first or top surface 50a, a second or bottom surface 50b opposite the top surface 50a, and a plurality of lateral surfaces 50c extending between the top surface 50a and the bottom surface 50b. In addition, each of the electronic components 50 are arranged in close proximity to one another along the upper surface 20a of substrate 20 such that the bottom surface 50b of each component 50 engages or abuts (at least partially) the upper surface 20a of substrate 20.

During operation, electrical components 50 generate thermal energy. To regulate the temperature of the components 50 during operation, a cooling fluid 30 is flowed or forced over the surface 20a and/or surface 20b of the substrate 20 to induce convective cooling of the components 50 through contact of the fluid 30 and the exposed surfaces (e.g., surfaces 50a, 50c). However, due to the close proximity of the components 50 along the upper surface 20a of substrate 20, the components 50 that are disposed toward the center of the arrangement (e.g., components 50') have a significantly decreased amount of surface area exposed to the fluid 30 when compared to the components 50 disposed along the edges of the arrangement (e.g., components 50"). As a result, during operation of system 10, the components 50' tend to have a higher average temperature than the components 50". In some circumstances, the components 50' may have a shorter working life due to this elevated average operating temperature. In addition, this difference in temperature between the components 50', 50" may, in some instances, limit the total number of components 50 that may be installed on substrate 20.

The embodiments disclosed herein include electronic systems that address this problem by having substrates that include one or more fluid flow channels extending therethrough such that one or more electronic components (e.g., components 50) may be positioned over the fluid flow channels to allow a greater amount of surface area of the components to be exposed to fluid flowing across the substrate during operations to thus improve the heat transfer properties of such components.

Figure 2:
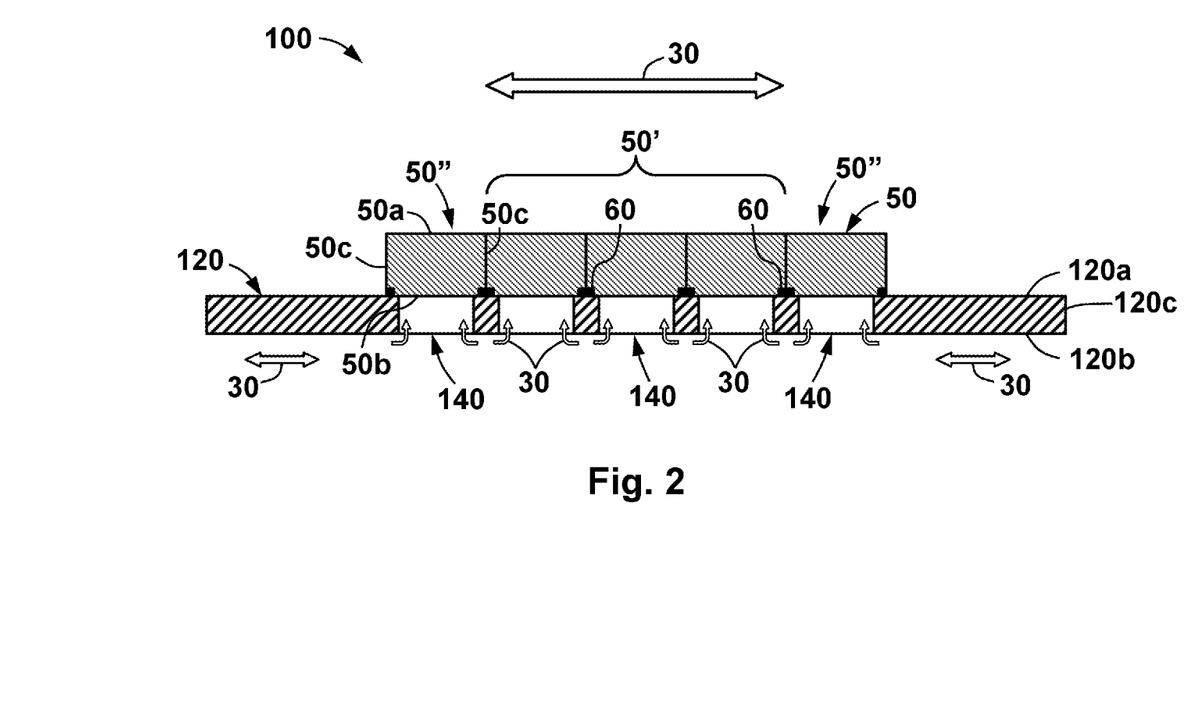
FIG. 2 shows a schematic side cross-sectional view of an electronic system in accordance with the principles disclosed herein.
Figure 3:
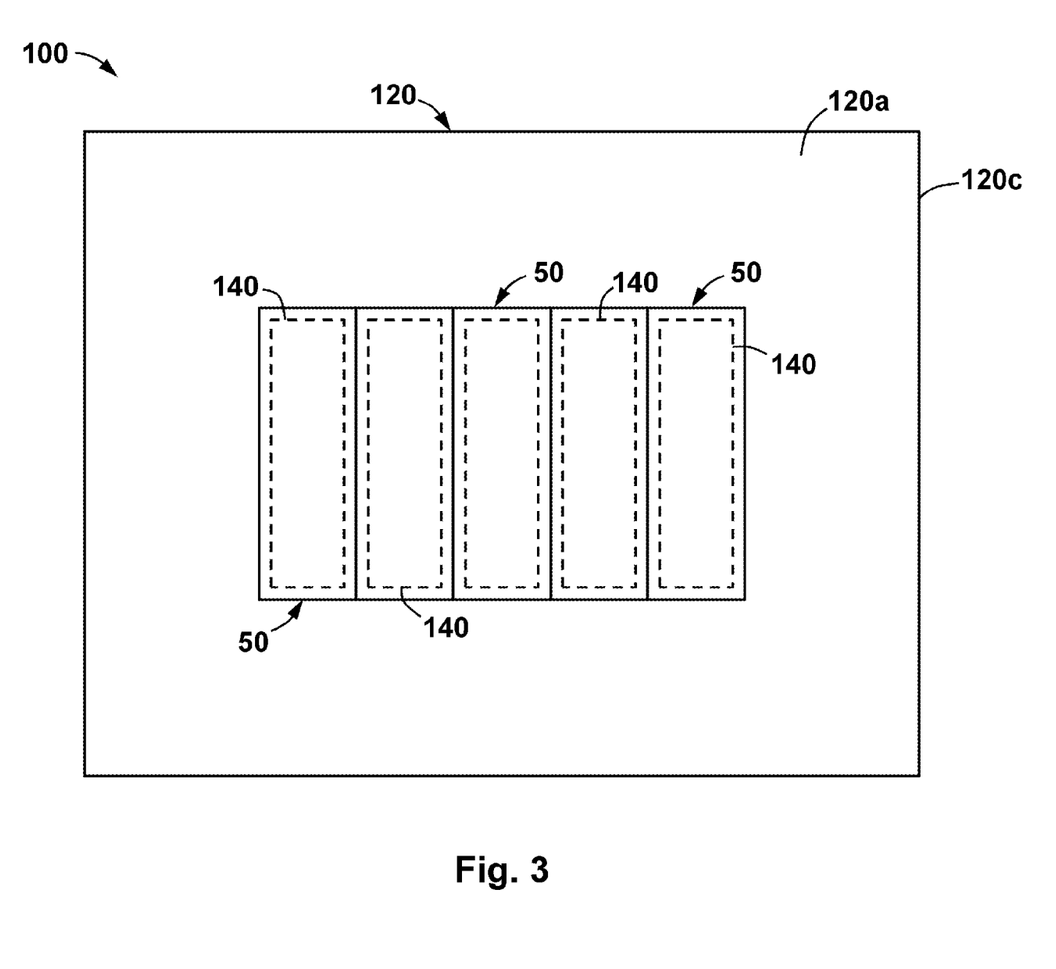
FIG. 3 shows a schematic top view of the system of FIG. 2.

Referring now to FIGS. 2 and 3, wherein an electronic system 100 in accordance with the principles disclosed herein is shown. System 100 includes a substrate 120 and a plurality of the electronic modules or components 50. Electronic components 50 may include any suitable electronic component for use with an electronic device or system. For example, electronic components 50 may comprise capacitors, resistors, sensors, switches, optical components, or some combination thereof. In particular, in this embodiment, components 50 each comprise optical modules.

In addition, the substrate 120 may comprise any substrate suitable for mounting an electronic component thereto. In some embodiments, substrate 120 comprises a PCB. In particular, substrate 120 includes a first or upper surface 120a, a second or lower surface 120b opposite the upper surface 120a, and a lateral edge 120c extending between the surfaces 120a, 120b along the entire periphery of substrate 120.

Referring still to FIGS. 2 and 3, substrate 120 also includes a plurality of channels or apertures 140 extending between the surfaces 120a, 120b. As will be described in more detail below, during operation channels 140 allow fluid (e.g., fluid 30) to flow therethrough in order to enhance the heat transfer properties of electronic components (e.g., components 50) disposed on substrate 120, and thus, may be referred to herein as "fluid flow channels" 140. As is best shown in FIG. 3, in this embodiment, the channels 140 are arranged substantially parallel to one another along the substrate 120; however, it should be appreciated that in other embodiments, one or more of the channels 140 may not be parallel to one another along the substrate 120 while still complying with the principles disclosed herein.

Figure 4:
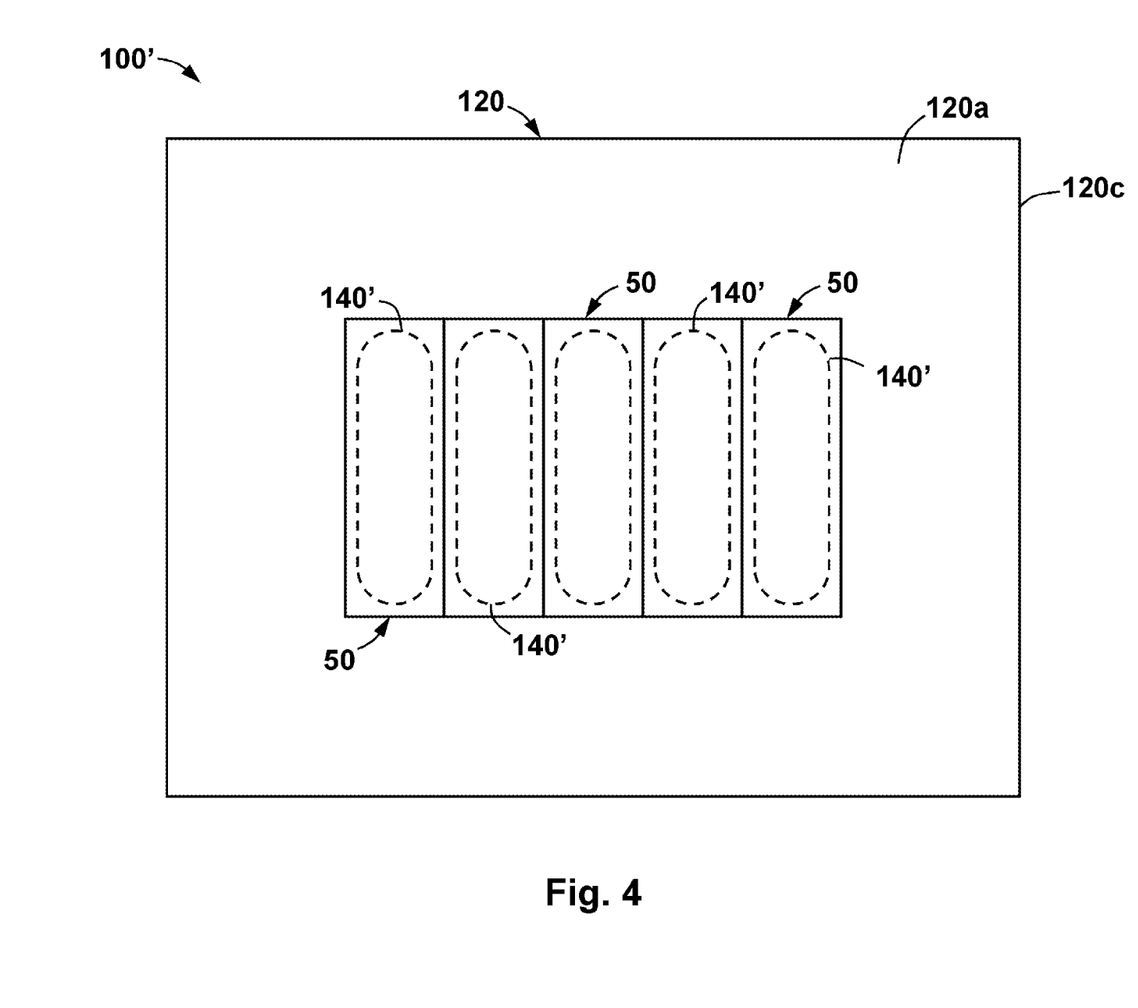
FIG. 4 shows a schematic top view of an electronic system in accordance with the principles disclosed herein.

In addition, as is best shown in FIG. 3, in this embodiment, fluid flow channels 140 are generally rectangular in shape when viewed in cross-section in a direction normal to one of the surfaces 120a, 120b; however, it should be appreciated that the channels 140 may comprise any number of suitable shapes while still complying with the principles disclosed herein. For example, in some embodiments, channels 140 may be square, circular, polygonal, hexagonal, octagonal, triangular, zigzag, or some combination thereof. Referring briefly to FIG. 4, one particular embodiment of an electronic system 100' in accordance with the principles disclosed herein includes channels 140' within substrate 120 that are generally the same as the channels 140 of system 100 except that channels 140' are formed as elongate ovals. As will be described in more detail below, in some embodiments, the size and shape of the channels 140 (or channels 140') are chosen to correspond to the bottom surface 50b of a corresponding electronic component 50.

Figure 5:
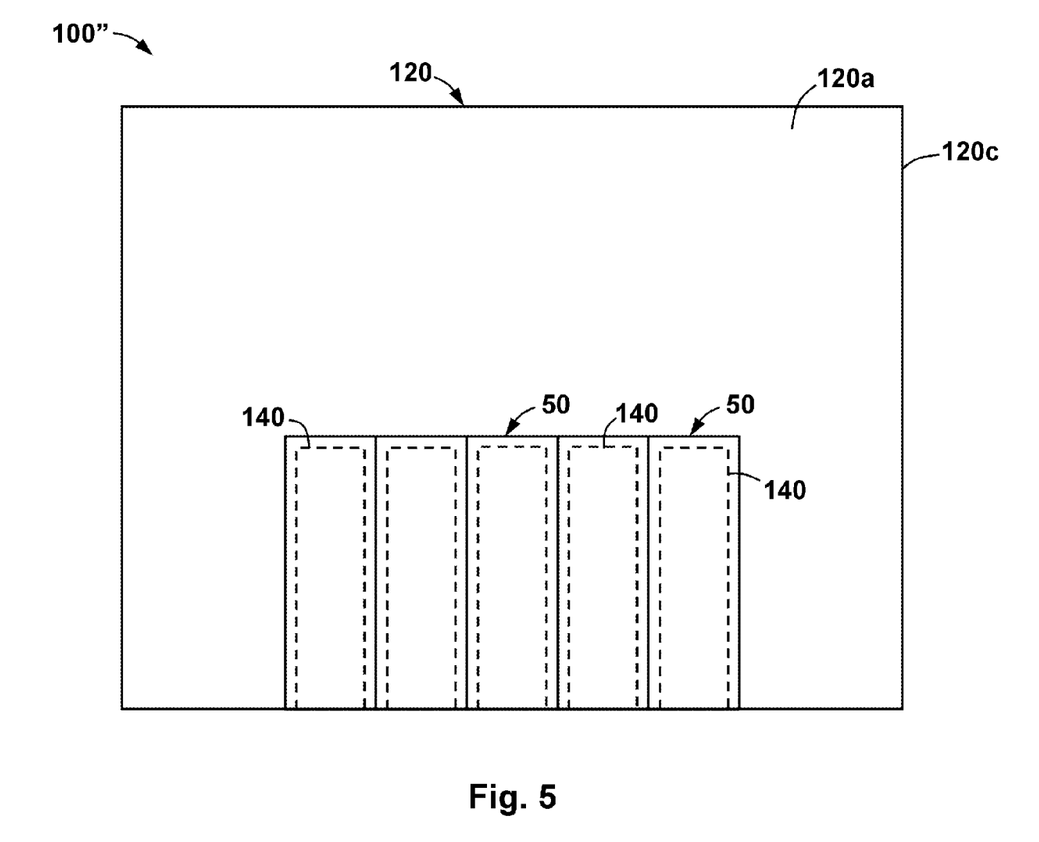
FIG. 5 shows a schematic top view of an electronic system in accordance with the principles disclosed herein.

Referring again to FIG. 3, in this embodiment, channels 140 are substantially disposed within the inner periphery of substrate 120 such that each channel 140 is substantially separate or distal from lateral edge 120c. However, it should be appreciated that in other embodiments, one or more of the channels 140 may be disposed substantially along the lateral edge 120c of substrate 120. For example, referring briefly to the embodiment of FIG. 5, a system 100" is generally the same as the system 100 of FIGS. 2 and 3 except that each of the channels 140 is disposed along the lateral edge 120c of substrate 120 such that channels 140 form a portion of the lateral edge 120c.

Referring again to FIGS. 2 and 3, each of the electronic components 50 are mounted to the upper surface 120a of substrate 120 such that the bottom surface 50b of each is disposed over one of the fluid flow channels 140. In addition, in this embodiment, each of the components 50 are electrically coupled to the substrate 120 (or electrical conductors disposed within substrate 120) through electrical connectors 60. However, it should be appreciated that components 50 may be electrically connected to substrate 120 and/or another electronic component (not shown) through any suitable connection such as, for example, a wireless, wired, and/or optical connection. In some embodiments, the size and shape of the channels 140 are chosen such that substantially all or most of the bottom surface 50b of the electronic components are exposed along the lower surface 120b of substrate through the channels 140. For example, in some embodiments, at least 50% of the bottom surface 50b of each electronic component 50 is exposed through the corresponding channel 140, while in other embodiments at least 80% of the bottom surface 50b of each component 50 is exposed through a corresponding channel 140. However, in some embodiments, the size and shape of channels 140 are chosen such that only a relatively small portion of the bottom surface 50b of each the electronic components 50 is exposed along the lower surface 120b of substrate 120 while still complying with the principles disclosed herein. Moreover, in some embodiments, the shape of the fluid flow channels 140 is substantially matches or is substantially similar to the shape of the bottom surface 50b of the corresponding components 50.

During operations, components 50 receive and/or emit electronic signals through the connectors 60 (or through any suitable connection as previously described), and thus, generate excess thermal energy. As a result, fluid 30 is flowed or forced over the lower surface 120b and upper surface 120a of substrate 120 in order to induce convective cooling of components 50 to maintain acceptable operating temperatures thereof. In this embodiment fluid 30 is air; however, any suitable fluid (e.g., liquid or gas) may be used while still complying with the principles disclosed herein. Due to the presence of channels 140, fluid 30 directed along the lower surface 120b flows through channels 140 and is therefore free to access and flow along the bottom surface 50b of the components 50. As a result, components 50 have a higher or increased amount of surface area exposed to cooling fluid than is typically the case for a conventional system (e.g., see system 10 shown in FIG. 1), and therefore experience enhanced cooling during such operations.

While embodiments disclosed above have shown only a single row of electronic components 50 disposed along an upper surface 120a of the substrate 120, in other embodiments, multiple rows of components 50 may be disposed along one of the surfaces 120a, 120b of the substrate 120.

Figure 6:
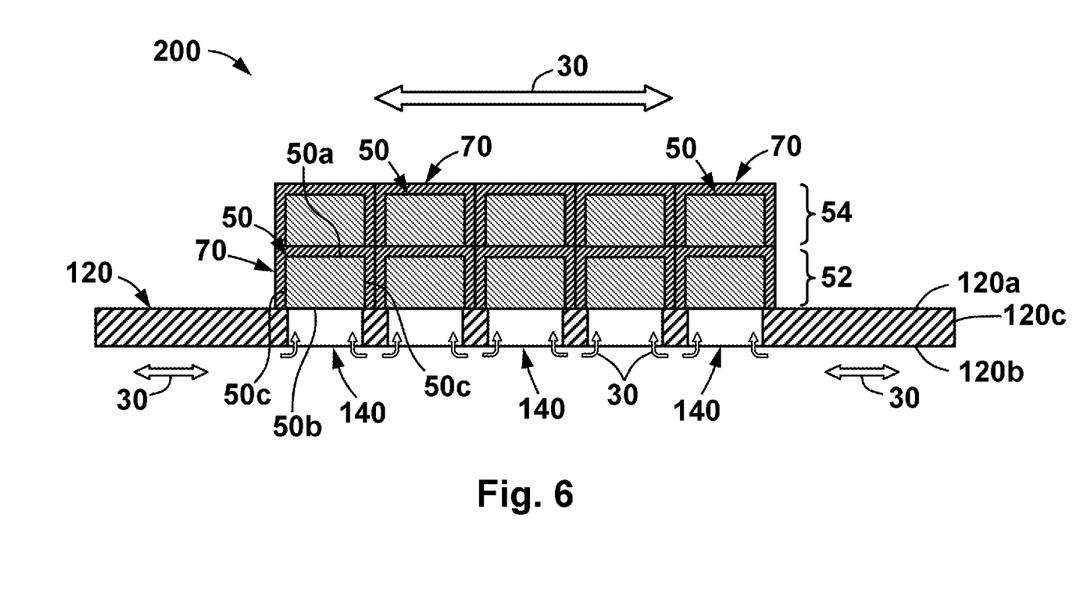
FIG. 6 is a schematic side cross-sectional view of an electronic system in accordance with the principles disclosed herein.

For example, referring now to FIG. 6, wherein an electronic system 200 is shown. Electronic system 200 is the same as the electronic system 100, previously described, except that the electronic components are arranged in a pair of stacked rows along the upper surface 120a of substrate 120. In particular, system 200 includes a first or lower row 52 of electronic components 50 mounted to the upper surface 120a and a second or upper row 54 of components 50 generally mounted on top of or above the lower row 52.

Figure 7:
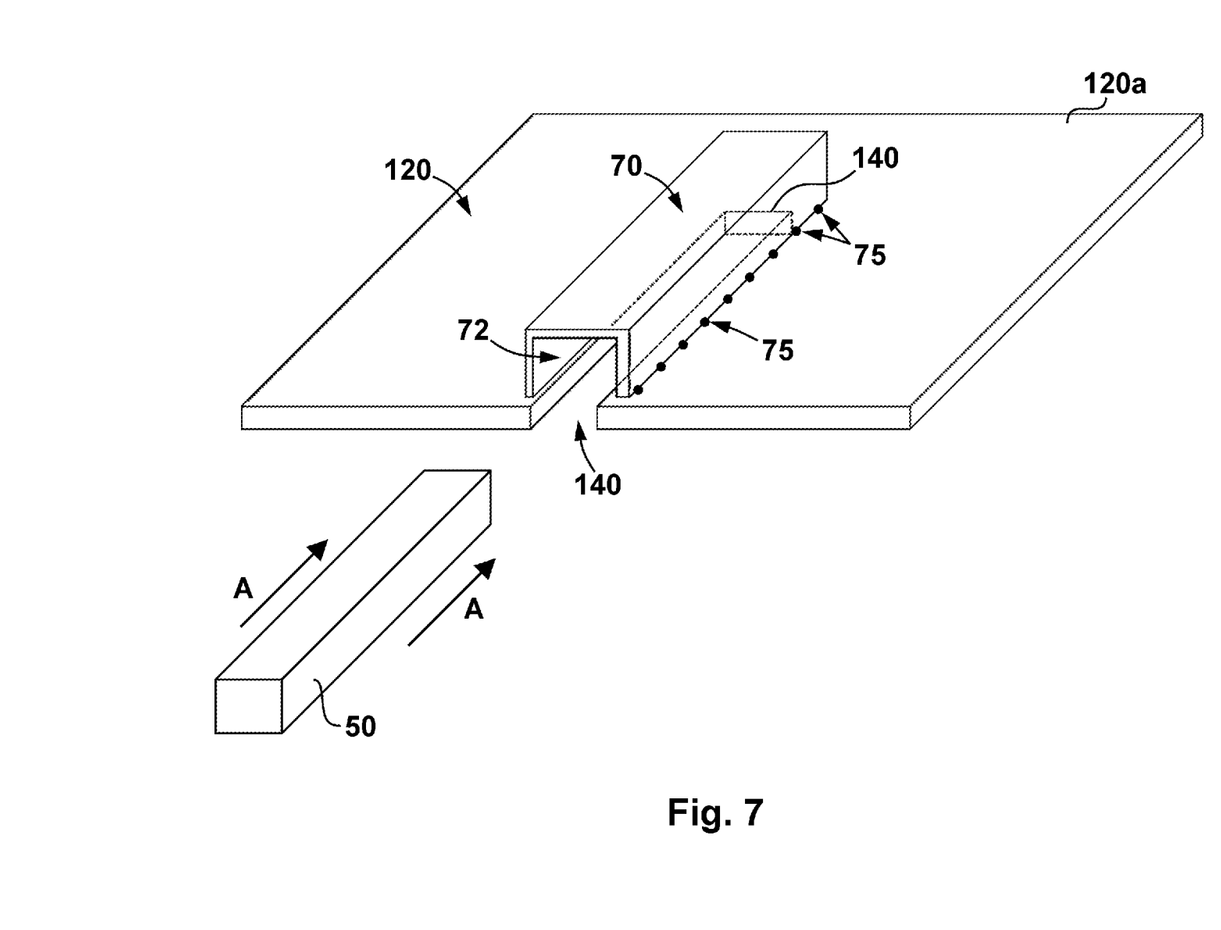
FIG. 7 is a schematic perspective view of one electromagnetic interference cage and electronic component of the system of FIG. 6.

In addition, in this embodiment, an electromagnetic interference (EMI) cage 70, which is some embodiments may comprise a metallic material, surrounds each of the components 50 in rows 52, 54 to at least partially insulate the components 50 from EMI produced during operation. Referring briefly now to FIG. 7, wherein one EMI cage 70 and electronic component 50 of the lower row 52 (see FIG. 6) are shown, it being understood that each EMI cage 70 and component 50 of the lower row 52 are configured in the same manner. For clarity, in the embodiment of FIG. 7, the component 50 is shown uninstalled and separated from both substrate 120 and cage 70.

Cage 70 includes an inner region 72 that is sized and shaped to receive a component 50 therein. In addition, cage 70 is mounted to the upper surface 120a of substrate 120 such that cage 70 is substantially centered over one of the fluid flow channels 140. Further, in this embodiment cage 70 is electrically grounded to substrate 120 through soldering 75.

Component 50 is installed within the inner region 72 by inserting component 50 within region 72 along direction A such that component 50 is disposed over the fluid flow channel 140. In some embodiments, component 50 is electrically coupled to cage 70 through connectors (not shown) that are disposed within the inner region 72; however, it should be appreciated that any suitable method or device for electrically coupling component 50 to other electrical components or systems may be used while still complying with the principles disclosed herein. It should also be appreciated that each of the cages 70 and components 50 of the upper row 54 (see FIG. 6) are configured essentially the same as the cages 70 and components 50 of the lower row 52 except that cages 70 are mounted to one of the cages 70 disposed within the lower row 52 rather than to the upper surface 120a of substrate 120, and components 50 disposed therein are not directly exposed to one of the fluid flow channels 140.

Referring again to FIG. 6, during operation, fluid 30 is flowed along the upper surface 120a and the lower surface 120b of substrate 120 such that each electronic component 50 experiences convective cooling. Typically, components 50 disposed along the lower row 52 receive less fluid flow (e.g., fluid 30) because they have less exposed surface area. However, because substrate 120 includes fluid flow channels 140 as shown, as fluid 30 is flowed across the lower surface 120b, the bottom surfaces 50b of each of the components 50 disposed along the lower row 52 are exposed to the fluid 30 through the fluid flow channels 140 in the same manner described above with regard to system 100. As a result, electronic components 50 disposed within the lower row 52 present a greater amount of exposed surface area and are more efficiently cooled than similarly situated components 50 in a conventional system (e.g., system 10).

Figure 8:
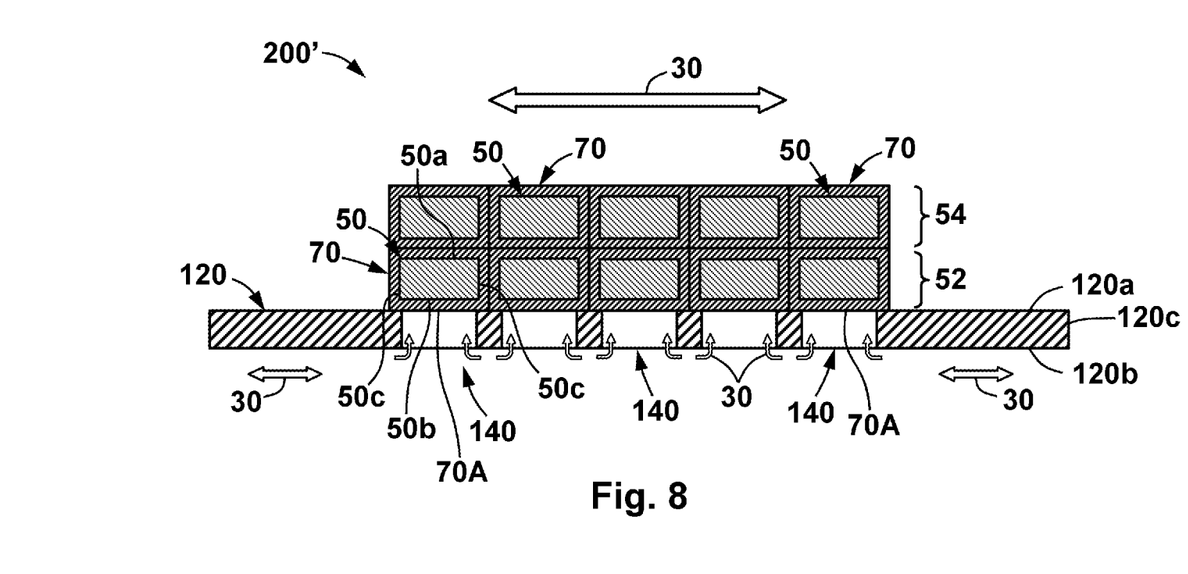
FIG. 8 is a schematic side cross-sectional view of an electronic system in accordance with the principles disclosed herein.

While the cages 70 of the electronic system 200 have been described and shown as including open lower ends such that components 50 disposed along lower row 52 are directly exposed to fluid flow channels 140, it should be appreciated that in other embodiments, one or more of the cages 70 may include a bottom or lower surface such that fluid 30 is not directly exposed to the bottom surfaces 50b of the corresponding components 50. For example, referring briefly to FIG. 8, where an electronic system 200' is shown. System 200' is substantially the same as the system 200 previously described except that each of the cages 70 further include a lower or bottom surface 70A. Thus, during operation, as fluid 30 is flowed along the lower surface 120b of substrate 120, the bottom surface 70A of each cage 70 along the lower row 52 (rather than the bottom surface 50b of each component 50 in row 52) is exposed to the fluid 30 through the fluid flow channels 140. Without being limited to this or any other theory, in this embodiment, cooling of each of the components 50 along the lower row 52 is at least partially accomplished through conductive heat transfer from the component 50 to the cage 70 and subsequent convective heat transfer from cage 70 to fluid 30 through contact of the fluid 30 and the lower surfaces 70A of cages 70 within the channels 140.

In the manner described, through use of a substrate (e.g., substrate 120) having one or more channels (e.g., channels 140) extending therethrough, more effective cooling of electronic components (e.g., components 50) may be achieved. Thus, through use of an electronic system (e.g., systems 100, 100', 200, and 200') in accordance with the principles disclosed herein, one may potentially extend the working life of electrical components included therein. In addition, through use of an electronic system (e.g., systems 100, 100', 200, and 200') in accordance with the principles disclosed herein, a greater number of electronic components (e.g., components 50) may be installed on the surface of a substrate (e.g., substrate 120).

What is claimed is:

1. An electronic system, comprising:
   a printed circuit board (PCB) including an aperture extending through the PCB; and
   an electronic component including a bottom surface and positioned on the PCB over the aperture to thereby expose the bottom surface of the electronic component to fluid flow through the aperture;
   wherein at least 50% of the bottom surface of the electronic component is exposed through the aperture; and
   wherein the aperture is formed at a peripheral edge of the PCB.

2. The electronic system of claim 1, wherein the PCB includes a plurality of apertures and the electronic component comprises a plurality of electronic components, each electronic component including a bottom surface that, when positioned over a corresponding aperture, is exposed to fluid flow through the corresponding aperture.

3. The electronic system of claim 2, wherein the plurality of apertures are arranged parallel to one another.

4. The electronic system of claim 1, wherein the aperture has a shape that is rectangular.

5. The electronic system of claim 1, wherein the aperture has a shape that is substantially similar to the shape of the bottom surface of the electronic component.

6. The electronic system of claim 1, wherein the electronic component is an optical module.

7. The electronic system of claim 1, further comprising an electromagnetic interference (EMI) cage coupled to the PCB and including an inner region that is configured to receive the electronic component to at least partially shield the electronic component from electromagnetic interference.

8. An electronic apparatus, comprising:
   a substrate including:
      a first surface;

a second surface opposite the first surface; and
a plurality of apertures each extending from the first surface to the second surface; and
a plurality of electronic components each having an engagement surface coupled to the first surface of the substrate at the engagement surface,
wherein each of the plurality of electronic components is positioned on the first surface of substrate such that the engagement surface is positioned over one of the plurality of apertures to allow a fluid to flow through the plurality of apertures from the second surface toward the engagement surface of each of the plurality of electronic components;
wherein one or more of the plurality of apertures is formed at a peripheral edge of the substrate.

9. The electronic system of claim 8, wherein one or more of the plurality of apertures has a shape that is rectangular.

10. The electronic system of claim 8, wherein one or more of the plurality of apertures has a shape that is one of square, circular, polygonal, hexagonal, octagonal, triangular, zigzag, and oval.

11. The electronic system of claim 8, wherein one or more of the plurality of apertures has a shape that is substantially similar to the shape of the engagement surface of the electronic component.

12. The electronic system of claim 8, wherein one or more of the plurality of electronic components is an optical module.

13. The electronic system of claim 10, further comprising a plurality of electromagnetic interference (EMI) cages, wherein each of the plurality of EMI cages is disposed on the first surface of the substrate and includes an inner region configured to receive one of the plurality of electronic components therein to at least partially shield the received electronic component from electromagnetic interference.

14. A printed circuit board, comprising:
a substrate including a first surface and a second surface opposite the first surface, and an aperture extending from the first surface to the second surface;
wherein the substrate is configured to have an electronic component mounted to the first surface such that a bottom surface of the electronic component is substantially disposed over the aperture;
wherein the aperture is formed at a peripheral edge of the substrate.

15. The printed circuit board of claim 14, wherein the aperture has a shape that is substantially similar to a shape of a bottom surface of the electronic component.

16. The electronic system of claim 1, wherein at least 80% of the bottom surface of the electronic component is exposed through the aperture.

17. The electronic system of claim 1, wherein substantially all of the bottom surface of the electronic component is exposed through the aperture.

* * * * *